United States Patent
Paul et al.

(10) Patent No.: US 10,247,798 B2
(45) Date of Patent: Apr. 2, 2019

(54) SIMULTANEOUS MULTI-SLICE MRI MEASUREMENT

(71) Applicants: Dominik Paul, Bubenreuth (DE); Mario Zeller, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 192 days.

(21) Appl. No.: 15/343,717

(22) Filed: Nov. 4, 2016

(65) Prior Publication Data

US 2017/0146624 A1 May 25, 2017

(30) Foreign Application Priority Data

Nov. 6, 2015 (DE) .......... 10 2015 221 888

(51) Int. Cl.
*G01V 3/00* (2006.01)
*G01R 33/483* (2006.01)
(Continued)

(52) U.S. Cl.
CPC ..... *G01R 33/4835* (2013.01); *G01R 33/4828* (2013.01); *G01R 33/561* (2013.01); *G01R 33/565* (2013.01); *G01R 33/5611* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612;
(Continued)

(56) References Cited

U.S. PATENT DOCUMENTS 6,025,716 A 2/2000 Deimling
7,034,530 B2 * 4/2006 Ahluwalia ......... G01R 33/3415
324/309
(Continued)

FOREIGN PATENT DOCUMENTS

DE 19718129 A1 11/1998
DE 102011082009 B3 2/2013
(Continued)

OTHER PUBLICATIONS

German Office Action for related German Application No. 10 2015 221 888.0 dated Feb. 24, 2017.
(Continued)

*Primary Examiner* — Thang X Le
(74) *Attorney, Agent, or Firm* — Lempia Summerfield Katz LLC

(57) ABSTRACT

A method for the simultaneous reception of magnetic resonance signals from two or more slices, a magnetic resonance apparatus, and a computer program product are provided. The method includes exciting first magnetic resonance signals of at least one first slice at a first excitation time. Further magnetic resonance signals of at least one further slice are excited at a further excitation time. The first and the further magnetic resonance signals are received simultaneously at one reception time.

19 Claims, 5 Drawing Sheets

(51) Int. Cl.
*G01R 33/561* (2006.01)
*G01R 33/565* (2006.01)
*G01R 33/48* (2006.01)

(58) Field of Classification Search
CPC .............. G01R 33/583; G01R 33/5659; G01R 33/56518; G01R 33/56536; G01R 33/56572; G01R 33/5614; G01R 33/5616; G01R 33/56509; G01R 33/341; G01R 33/385; G01R 33/56358; A61B 5/055; A61B 5/0555; A61B 5/7278; A61B 5/725
See application file for complete search history.

(56) References Cited

U.S. PATENT DOCUMENTS

| | | | |
|---|---|---|---|
| 2010/0259260 A1 | 10/2010 | Lee et al. | |
| 2013/0057280 A1* | 3/2013 | Feiweier | G01R 33/4835 324/309 |
| 2013/0057281 A1 | 3/2013 | Feiweier | |
| 2013/0193966 A1* | 8/2013 | Larson | G01R 33/4608 324/309 |
| 2013/0342206 A1* | 12/2013 | Ugurbil | G01R 33/4835 324/309 |
| 2014/0210471 A1 | 7/2014 | Stemmer | |
| 2015/0226823 A1* | 8/2015 | Speier | G01R 33/34092 324/309 |
| 2015/0260808 A1* | 9/2015 | Katscher | G01R 33/4833 324/309 |
| 2015/0316634 A1* | 11/2015 | Griswold | G01R 33/5612 324/309 |
| 2015/0346300 A1* | 12/2015 | Setsompop | G01R 33/4828 324/309 |

FOREIGN PATENT DOCUMENTS

| | | |
|---|---|---|
| DE | 102011082010 A1 | 3/2013 |
| DE | 102013201616 B3 | 7/2014 |

OTHER PUBLICATIONS

Larkman D. J. et al.; "Use of Multicoil Arrays for Separation of Signal from Multiple Slices Simultaneously Excited", in: Journal of Magnetic Resonance Imaging; vol. 13; pp. 313-317; 2001.
Bernstein M. et. al.: "Handbook of MRI Pulse Sequences", Elsevier Academic Press, 2004, Chapter 17, pp. 860-861.
Biospec in "www.bruker.com/de/products/mr/preclinical-mri/biospec/overview.html", Sep. 2015.
Cauley, S. et. al.: "Interslice Leakage Artifact Reduction Technique for Simultaneous Multislice Acquisitions", in: Magnetic Resonance in Medicine,. vol. 72, pp. 93-102; 2014.
Feinberg et al: "Simultaneous Echo Refocusing in EPI"; MRM vol. 48, pp. 1-5; 2002.
K. Setsompop, et al., Improving diffusion MRI using simultaneous multi-slice echo planar imaging, NeuroImage 63 (2012) 569-580.
Setsompop Kawin et.al.: "Blipped-Controlled Aliasing in Parallel Imaging for Simultaneous Multislice Echo Planar Imaging with Reduced g-Factor Penalty", in: Magnetic Resonance in Medicine, vol. 67, pp. 1210-1224, (first published online 2011); 2012.

* cited by examiner

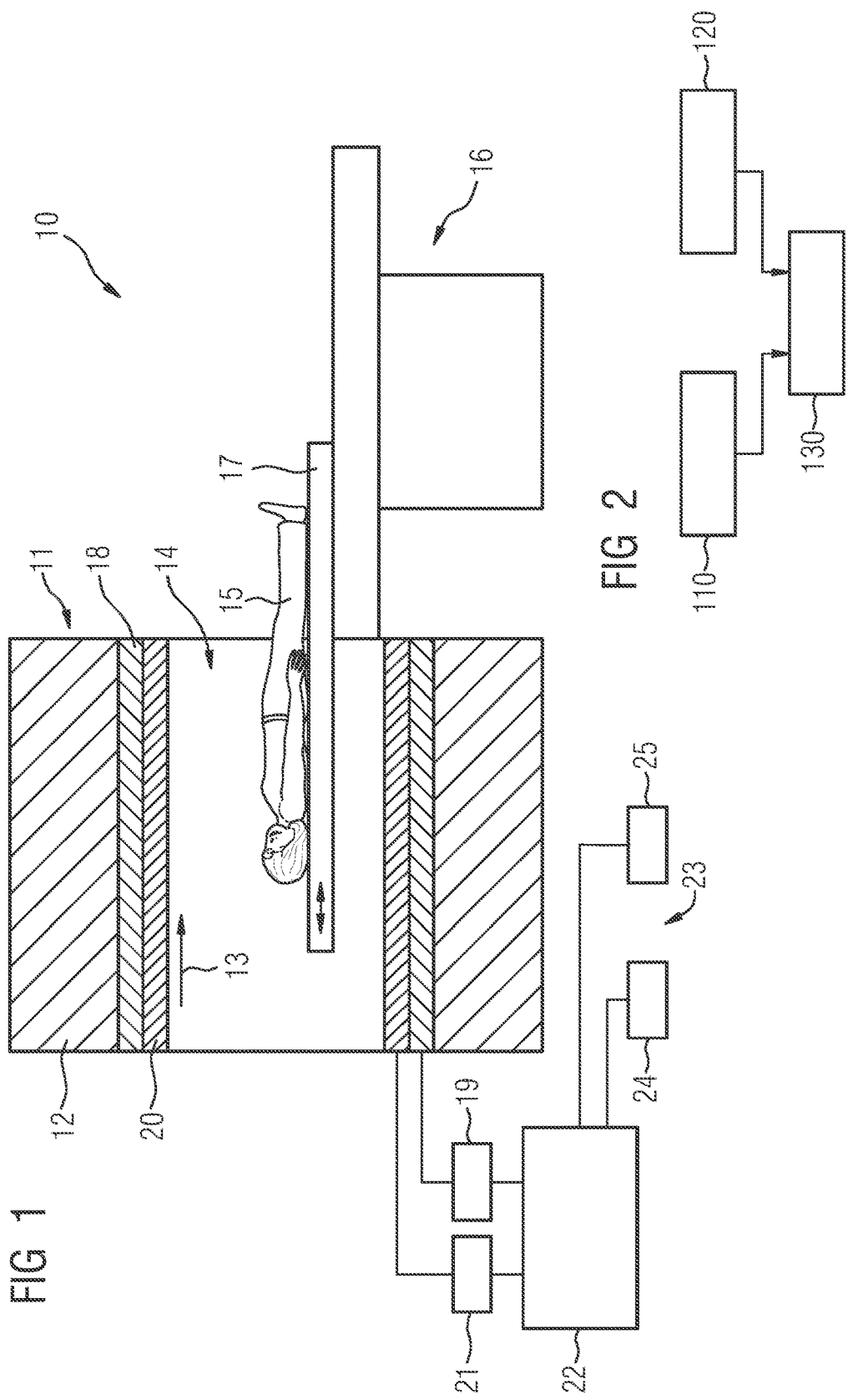

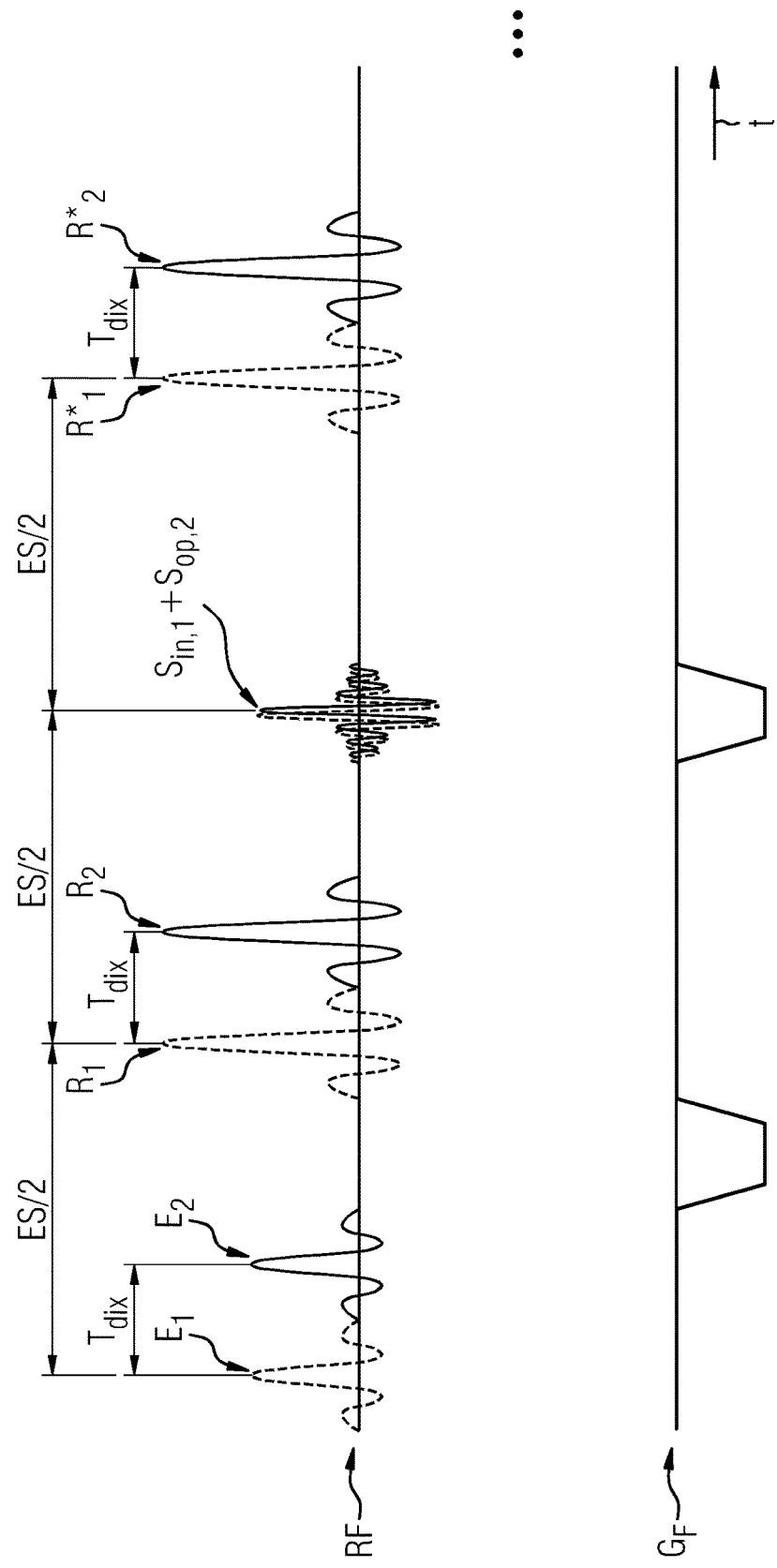

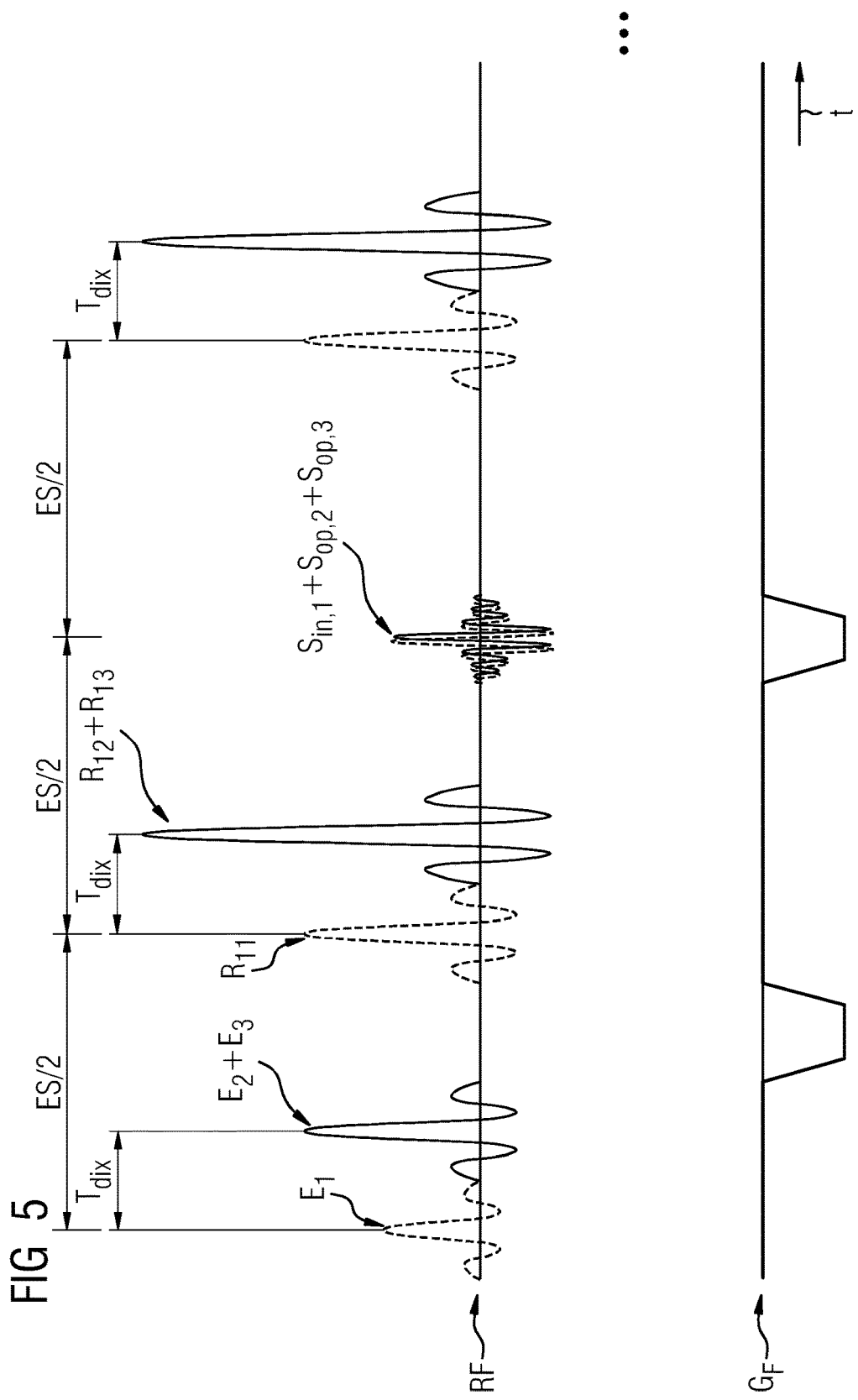

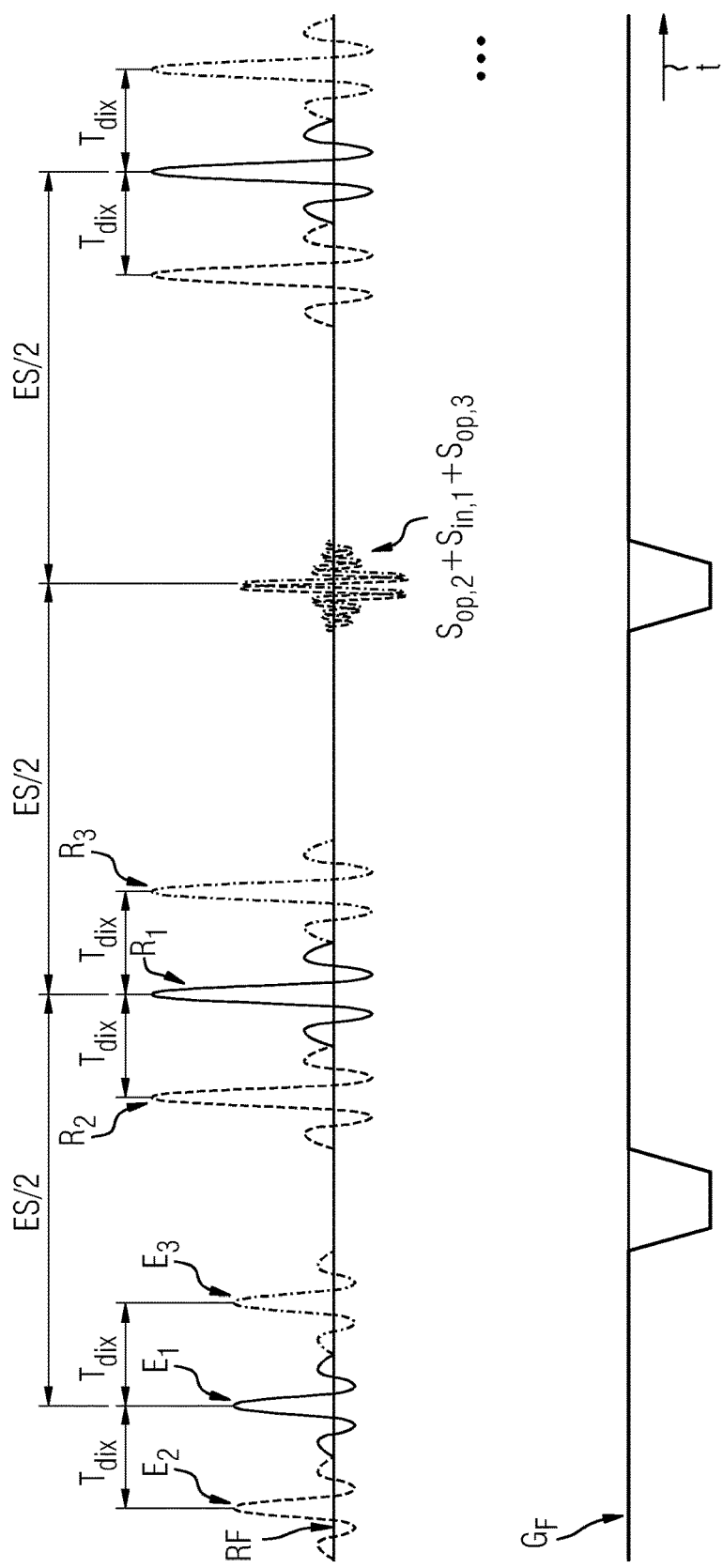

SIMULTANEOUS MULTI-SLICE MRI MEASUREMENT

CROSS-REFERENCE TO RELATED APPLICATIONS

The present patent document claims the benefit of DE 102015221888.0, filed on Nov. 6, 2015, which is hereby incorporated by reference in its entirety.

BACKGROUND

The present embodiments relate to a method for the simultaneous reception of magnetic resonance signals from two or more slices, a magnetic resonance apparatus and a computer program product.

Imaging methods represent important tools in medical technology. For example, magnetic resonance tomography (MRT) is characterized in the field of clinical imaging by high and variable soft-tissue contrasts. However, the performance of an MRT examination on an object under examination often requires a long scanning time (e.g. if there is a requirement to acquire a plurality of slices of the object under examination).

SUMMARY AND DESCRIPTION

The scope of the present invention is defined solely by the appended claims and is not affected to any degree by the statements within this summary.

The present embodiments may obviate one or more of the drawbacks or limitations in the related art. For example, a technique is provided that enables a plurality of slices to be scanned in a short scanning period.

A method is provided for the simultaneous reception of magnetic resonance signals from two or more slices. The method includes that first magnetic resonance signals of at least one first slice are excited at a first excitation time. Further magnetic resonance signals of at least one further slice are excited at an at least one further excitation time. The first and the further magnetic resonance signals are received simultaneously at one reception time.

The simultaneous reception of magnetic resonance signals from a plurality of slices may enable the scanning time to be reduced because the magnetic resonance signals from said plurality of slices do not have to be received successively. In addition, such as compared to the so-called fast Dixon method, simultaneous reception may enable a low readout bandwidth and/or a high image resolution resulting in improved image quality. A short readout time may also enable the sequence sections, and hence the entire sequence, to be shortened.

The two or more slices are may be slices of an object under examination (e.g., a human or animal patient). A slice may be a thin three-dimensional cuboid that may be uniquely defined by the slice position, field of view (FoV) and the slice thickness. The mid-plane of the slice may define an image plane of an image reconstructed from the received magnetic resonance signals. The two or more slices (e.g., the at least one first slice and the at least one further slice) may be spaced apart from one another and/or aligned in parallel to one another.

The excitation of the magnetic resonance signals may take place such that transmitter coils of magnetic resonance apparatus generate radio-frequency (RF) electromagnetic signals (e.g., RF pulses). These RF pulses are irradiated into in the object under examination where the RF pulses excite atomic nuclei of the object under examination. Suitable switching of magnetic field gradients may excite the atomic nuclei in a slice-selective manner. The excited atomic nuclei relax and emit magnetic resonance signals that, as a rule, are received by receiver coils of the magnetic resonance apparatus.

The excitation of magnetic resonance signals at a specific excitation time only excites atomic nuclei of a specific slice, and/or atomic nuclei of different slices are excited in a specific way enabling the reconstruction of images of the different slices from the received magnetic resonance signals.

The excitation of first magnetic resonance signals of at least one first slice takes place at a first excitation time (e.g., one or more slices may be excited at the first excitation time).

The excitation of further magnetic resonance signals of at least one further slice takes place at an at least one further excitation time (e.g., one or more further slices may be excited at one or more further excitation times). For example, two further slices U and V at one further excitation time A and one further slice W at another further excitation time B may be excited. These further excitation times may be identical to the first excitation time, or partially or completely different therefrom. Excitation of the further magnetic resonance signals may be perform completely before excitation of the first magnetic resonance signals, partially before and partially after excitation of the first magnetic resonance signals, or completely after excitation of the first magnetic resonance signals.

Because the excitation normally takes place with the aid of radio-frequency excitation pulses and an excitation pulse has a finite length in time, the excitation time may be understood to be the time that the excitation pulse reaches its maximum amplitude and/or a time average of a rising edge and a falling edge of the excitation pulse.

Simultaneous reception of the first and further magnetic resonance signals takes place at one reception time (e.g., the magnetic resonance signals excited in the excitation of the first magnetic resonance signals and in the excitation of the further magnetic resonance signals are at least partially received within the framework of usual reception efficiencies and/or reception sensitivities of magnetic resonance apparatuses at one reception time).

Since magnetic resonance signals may have a pulsed shape and a finite temporal extension, the reception, and a readout process, of a magnetic resonance pulse takes place over a finite length of time. Consequently, the reception time may be understood to be the time that the magnetic resonance pulse reaches its maximum amplitude and/or a time average of a rising and falling edge of the magnetic resonance pulse.

The simultaneously received magnetic resonance signals for each of the excited slices (e.g., the at least one first slice and the at least one further slice) may be used to reconstruct at least one image. Imaging information from the simultaneously received magnetic resonance signals is separated for each of the excited slices.

The first excitation time may be identical to the at least one further excitation time and/or spaced apart from the at least one further excitation time by an integral multiple N of a phase inversion time $T_{dix}$. For example, if magnetic resonance signals are excited at more than only one further excitation time, one part of the further excitation times may be identical to the first excitation time and another part may be spaced apart therefrom. Additionally, all further excitation times may be identical to the first excitation time or all further excitation times to be spaced apart therefrom.

The spacing may be set such that the at least one further excitation point is arranged before or after the first excitation time. The integral multiple N may be equal to 1.

The length of time between two excitation times $T_{dix}$ corresponds to the length of time that a signal component of the magnetic resonance signals undergoes a phase inversion relative to another signal component of the magnetic resonance signals. As a rule, magnetic resonance signals represent radio-frequency electromagnetic signals, and may have overlapping components. The signal components may be induced by the excitation of atomic nuclei of different components of the object under examination (e.g., fat and/or water).

A specific phase angle may be assigned to the signal components at a specific time. The relative phase angle of different signal components may change (e.g., shift over time). For example, the relative phase angles may be influenced by an external magnetic field. A relative phase inversion may shift the relative phase angle by a phase angle of 180° in degrees and/or π in radians. Magnetic resonance signals with signal components with a relative phase angle shifted by 180° and/or π may be referred to as magnetic resonance signals with an opposite phase angles. Magnetic resonance signals with signal components whose phase angles are not shifted relative to another at a specific time may be referred to as magnetic resonance signals with the same phase angle.

The received magnetic resonance signals may have signal components with the same angle and/or opposite phase angle (e.g., the received magnetic resonance signals have signal components that have a same and/or an opposite phase angle).

For example, in the case of the simultaneous reception of the magnetic resonance signals, first magnetic resonance signals may be received from a slice R. Said signals overlap further magnetic resonance signals from slices S and T and components of the magnetic resonance signals from slice S have an opposite phase angle. The phase angle of the components of the magnetic resonance signals from slices R and T is the same.

The simultaneous reception of superimposed magnetic resonance signals with respective signal components of a different (e.g., opposite) phase angle from different slices enables the time-efficient acquisition of data, that may be processed according to the Dixon method and/or simultaneous multi-slice methods (SMS methods) known from the prior art. The maximum of the component with the same phase angle may not be temporally superimposed with the maximum of the component with the opposite phase angle so that the present embodiments may also be used with systems with weaker RF amplifiers.

The phase inversion time $T_{dix}$ may be a function of a basic magnetic field strength $B_0$, a Larmor constant γ and a chemical shift δ (e.g., represented by the relationship $T_{dix} = (2B_0 γ δ)^{-1}$).

The basic magnetic field $B_0$ is may a magnetic field generated by the magnetic resonance apparatus, e.g. with the aid of a superconducting basic magnet at the site of the slices of the object under examination to be measured. For the performance of an MRT, it may be between 0.1 and 30 tesla.

The Larmor constant γ (e.g., the gyromagnetic ratio) is a material-specific value and for hydrogen nuclei (e.g., approximately 42.58 MHz/T). The product of the Larmor constant γ and basic magnetic field $B_0$ may be used calculate the Larmor frequency (e.g., the frequency at which nuclear spins of atomic nuclei exposed to the basic magnetic field with the strength $B_0$, and hence also their transverse magnetizations undergo precession).

The chemical shift δ describes a shift of the resonance frequency of an atomic nucleus as a function of the chemical bond of the atom and/or the structure of the molecule. For example, the chemical shift δ between an atomic nucleus in a water molecule and an atomic nucleus in a fat molecule is approximately 3.4 ppm.

The tissue of the object under examination normally includes different types of atomic nuclei (e.g., protons in fat and water molecules, both of which may be excited during an MRT examination of a human or animal body). The different types of atomic nuclei contribute to the totality of the magnetic resonance signals (e.g., one signal component of the magnetic resonance signals originates from the excitation of the protons in fat molecules and another component originates from the excitation of the protons in water molecules). Due to the different Larmor frequencies, the chemical shift δ between fat and water causes the nuclear spins of fat and water to undergo precession with a correspondingly angular velocity. As a result, the relative phase angle of the signal components also changes over time. The time in which a phase inversion (e.g., a shift of the relative phase angle about 180° or π takes place) may be $T_{dix}$.

The simultaneous reception of superimposed magnetic resonance signals, including signal components with material-specific (e.g., the same and/or opposite phase angles enables the time-efficient acquisition of data), by suitable processing of the received magnetic resonance signals, may enable the generation of informative material-specific images.

One embodiment provides that the received magnetic resonance signals are used to generate at least one in-phase image and/or at least one opposed-phase image. In-phase images and opposed-phase images may provide valuable data for diagnosis.

An in-phase image may be obtained by taking a measurement at a time when two components in the tissue (e.g., fat and water) are in the same phase (e.g., have the same phase angle). With the same phase angle, the transverse magnetizations of the atomic nuclei of both components may have the same orientation and may be added together. An opposed-phase image may be obtained by measuring at a time that two components in the tissue are in the opposite phase (e.g., have an opposite phase angle such that the transverse magnetizations have the opposite orientation and partially compensate each other or completely delete each other).

The received magnetic resonance signals may be used to generate at least one water image and/or at least one fat image.

In a fat image (e.g., generated using the Dixon technique), only the signal component of the fat-bound protons may be displayed while and the water component may be at least partially suppressed. Conversely, a water image only represents the signal component of the water-bound protons and at least partially suppresses the fat component.

A water image of a slice may be determined by the addition of an in-phase image of the slice and an opposed-phase image of the slice. A fat image of a slice may be determined by subtracting an opposed-phase image of the slice from an in-phase image of the slice.

Fat and water images may enable the efficient separation of fat and water resulting in easier and/or improved diagnosis.

In an embodiment, excitation of the first magnetic resonance signals, excitation of the further magnetic resonance signals, and simultaneous reception of the first and further magnetic resonance signals are performed i-times (e.g., with i greater than 1). In this embodiment, magnetic resonance signals with the same and opposite phase angle may be received once for different slices in each case (e.g., for each of the different slices). Magnetic resonance signals with signal components with the same phase angle are acquired and magnetic resonance signals with signal components with an opposite phase angle are acquired. For example, an in-phase image and an opposed-phase image may be generated for the different slices in each case. In a single pass, no magnetic resonance signals with both the same and the opposite phase angle are acquired from a specific slice because, as a rule, the magnetic resonance signals do not coincide in time and may not be received simultaneously.

In other words, multiple performance enables a two-dimensional data space to be filled, the first dimension depicting the different slices and the second dimension depicting the phase angles "same" and "opposite" and/or the image types "in-phase image" and "opposed-phase image." The different slices may include the at least one first slice and the at least one further slice. As a rule, with s different slices with t excited slices per pass, the complete filling of a data space may require a total of i=ceil(2s/t) passes if, for each of the different slices, overall magnetic resonance signals with same phase angle are to be acquired once and magnetic resonance signals with the opposite phase angle are to be acquired once.

The excited slices of each pass are selected such that the slices are spaced as far apart from each other as possible to reduce aliased artifacts. For example, the slices of each pass may be selected such that the smallest distance that occurs between the slices of all passes is maximized.

By way of example, a total of six slices 1 to 6 are examined. In one pass of excitation of the first magnetic resonance signals, excitation of the further magnetic resonance signals, and simultaneous reception of the first and further magnetic resonance signals, three slices are excited. In a first pass, magnetic resonance signals with the same phase angle are received from the slice 1, magnetic resonance signals with the same phase angle are received from the slice 3 and magnetic resonance signals with the opposite phase angle are received from the slice 5. In a second pass, magnetic resonance signals with the opposite phase angle are received from the slice 1, magnetic resonance signals with the opposite phase angle are received from the slice 3 and magnetic resonance signals with the same phase angle are received from the slice 5. In a third pass, magnetic resonance signals with the same phase angle are received from the slice 2, magnetic resonance signals with opposite phase angle are received from the slice 4 and magnetic resonance signals with the opposite phase angle are received from the slice 6. In a fourth pass, magnetic resonance signals with the opposite phase angle are received from the slice 2, magnetic resonance signals with the same phase angle are received from the slice 4 and magnetic resonance signals with the same phase angle are received from the slice 6. Therefore, with six different slices, there are a total of four passes if three slices are to be excited per pass.

Therefore, it is possible for a fat image and a water image to be generated for each of the different slices. The scanning time may be greatly reduced compared to a conventional acquisition method.

One embodiment of a method provides that the excitation of the first magnetic resonance signals at the first excitation time is performed using a first excitation pulse and the excitation of the further magnetic resonance signals at the at least one further excitation time is performed using at least one further excitation pulse. The first excitation pulse and the at least one further excitation pulse are identical or at least partially different. For example, the shape of the first excitation pulse and the shape of the at least one further excitation pulse may be identical or at least partially different.

For example, at least one of the excitation pulses may be a minimum-phase Shinnar-Le Roux pulse (SLR pulse) phase and/or at least one of the excitation pulses may be a maximum-phase Shinnar-Le Roux pulse, enabling different dephasing gradient moments to be compensated for both pulses.

After excitation of the magnetic resonance signals, the magnetic resonance signals are refocused using refocusing pulses (e.g., the first magnetic resonance signals are refocused using a first refocusing pulse and the further magnetic resonance signals are refocused using at least one further refocusing pulse). In this case, the first refocusing pulse and the at least one further refocusing pulse are identical or at least partially different. For example, the shape of the first refocusing pulse and the shape of the at least one further refocusing pulse may be identical or at least partially different.

For example, at least one of the refocusing pulses may be a minimum-phase Shinnar-Le Roux pulse (SLR pulse) and/or at least one of the refocusing pulses may be a maximum-phase Shinnar-Le Roux pulse.

A plurality of slices may be simultaneously excited at the first excitation time and/or at one or more of the at least one further excitation times to reduce the scanning time compared to conventional methods.

For example, the simultaneous excitation of a plurality slices takes place by a multiband pulse (e.g., the excitation of the first magnetic resonance signals and/or the excitation of at least one part of the further magnetic resonance signals may take place by a single multiband pulse).

With a multiband pulse (e.g., for each slice to be excited) a linear phase ramp is added to a conventional excitation pulse. This linear phase ramp results in a slice shift in the position space. For example, it is possible to utilize the so-called Fourier shift theorem (e.g., stating that a periodicity of a ramp in a space results in a linear shift by the periodicity in the reciprocal space). Finally, the excitation pulses modified in this way for all slices are added, resulting in a baseband-modulated multiband pulse.

The use of a multiband pulse of this kind enables the slice components of the simultaneously received magnetic resonance signals to be separated effectively.

One embodiment of the method provides that excitation of the first magnetic resonance signals, excitation of the further magnetic resonance signals, and simultaneous reception of the first and further magnetic resonance signals are performed within a gradient echo sequence and/or a spin echo sequence (e.g., a turbo spin echo sequence (TSE sequence), a HASTE sequence and/or a PROPELLER/BLADE sequence).

A HASTE sequence (e.g., half Fourier acquired single shot turbo spin echo) may be used for the sequential scanning of highly-resolved T2-weighted images. In this example, all of the image information may be acquired following one single excitation pulse, wherein all the echoes are generated by the following refocusing pulses. The HASTE sequence may be used to perform particularly quick scans.

A PROPELLER/BLADE sequence may be insensitive to movements of the patient because a k-space center is acquired anew with each excitation pulse.

Depending on the manufacturer-specific designation system, the turbo spin echo sequence may also be called a fast-spin echo sequence (e.g., FSE sequence) and the HASTE sequence may also be called a single-shot FSE or single-shot TSE or FASE sequence.

In one embodiment, the method includes at least one optimization method for simultaneous multi-slice acquisition (e.g., CAIPIRINHA, blipped CAIPI and/or simultaneous echo refocusing (SER), slice-GRAPPA (SG), split slice-GRAPPA (SP-SG), and/or Hadamard encoding). In this embodiment, CAIPIRINHA, blipped CAIPI and SER represent scanning methods and SG and SP-SG represent reconstruction methods.

CAIPIRINHA (e.g., controlled aliasing in parallel imaging results in higher acceleration) uses interslice image shifts and increases a distance between aliased voxels, enabling the images of the individual slices from the simultaneously received magnetic resonance signals to be better separated from one another. Blipped CAIPI represents a development of this method (e.g., for use in EPI sequences). The interslice image shifts are provided during the reading out of the magnetic resonance signals by gradient blips on the slice axis and/or by the modulation of the phase of the excitation pulses. This results in a reduced g-factor penalty such that the signal-noise ratio may be increased. SG and SP-SG represent methods for unfolding the slices from jointly received magnetic resonance signals (e.g., acquired by CAIPIRINHA and/or blipped CAIPI). (See Setsompop et al., Blipped-controlled aliasing in parallel imaging for simultaneous multi-slice echo planar imaging with reduced g-factor penalty, Magn. Reson. Med. 67 (2012) 1210-1224; Setsompop et al, Improving diffusion MRI using simultaneous multi-slice echo planar imaging, NeuroImage 63 (2012) 569-580; Cauley et al., Interslice leakage artifact reduction technique for simultaneous multi-slice acquisitions, Magn. Reson. Med. 72 (2014) 93-102). SER is a further advantageous method for simultaneous slice measurement. (Feinberg et al., Simultaneous echo refocusing in EPI, Magn. Reson. Med. 48(1) (2002) 1-5).

A magnetic resonance apparatus with a radio-frequency antenna unit is provided. The magnetic resonance apparatus is configured to perform a method for the simultaneous reception of magnetic resonance signals from two or more slices. The method includes, using a radio-frequency antenna, to excite first magnetic resonance signals of at least one first slice at a first excitation time and to excite further magnetic resonance signals of at least one further slice at an at least one further excitation time. The radio-frequency antenna unit is also configured to receive the first and the further magnetic resonance signals simultaneously at one reception time.

The radio-frequency antenna unit may include transmitter coils for the transmission of radio-frequency excitation pulses and receiver coils for the reception of the magnetic resonance signals. A coil may serve as both a transmitter coil and a receiver coil. However, separate coils may be used for transmission and reception (e.g., local coils for reception).

The magnetic resonance apparatus also includes a radio-frequency antenna control unit that may be used to control the radio-frequency antenna unit. The magnetic resonance apparatus also includes a system control unit that may also control the radio-frequency antenna unit.

A computer program product is provided including a program that may be loaded directly into a memory of a programmable system control unit of a magnetic resonance apparatus. The control unit may, with the program, carry out a method for the simultaneous reception of magnetic resonance signals from two or more slices when the program is executed in the system control unit of the magnetic resonance apparatus.

A computer program product is also provided including a program that may be loaded directly into a memory of a programmable system control unit of a magnetic resonance apparatus (e.g., including libraries and auxiliary functions in order to carry out a method for the simultaneous reception of magnetic resonance signals from two or more slices when the computer program product is executed in the system control unit of the magnetic resonance apparatus). In this embodiment, the computer program product may include software with source code that is compiled and linked, or is interpreted, or executable software code, which for execution purposes, is loaded into the system control unit. The computer program product configured for the simultaneous reception of magnetic resonance signals from two or more slices to be carried out quickly, identically repeatedly and robustly. The computer program product may be configured to carry out the method acts of the system control unit. In this embodiment, the system control unit may include an appropriate working memory, an appropriate graphics card or an appropriate logic unit such that the respective method acts may be carried out efficiently. The computer program product may be stored on a computer-readable medium or on a network or server from where the computer program product may be loaded into the processor of a local system control unit that may be directly connected to the magnetic resonance apparatus or included as part of the magnetic resonance apparatus. Control information of the computer program product may be stored on an electronically readable data medium. The control information of the electronically readable data medium may be configured such that the control information carries out a method when the data medium is used in a system control unit of a magnetic resonance apparatus. Examples of electronically readable data media include a DVD, a magnetic tape or a USB stick on which electronically readable control information (e.g., software) is stored. When this control information is read from the data medium and stored in a system control unit of the magnetic resonance apparatus, the embodiments of the above-described methods may be performed. Hence, the present embodiments may be based on said computer-readable medium and/or said electronically readable data medium.

BRIEF DESCRIPTION OF THE DRAWINGS

FIG. 1 is a schematic view of a magnetic resonance apparatus according to an embodiment.

FIG. 2 is a block diagram of a method for the simultaneous reception of magnetic resonance signals from two or more slices.

FIG. 4 is a sequence diagram according to an embodiment of a TSE Dixon sequence with the excitation of a first slice and a further slice.

FIG. 5 is a sequence diagram according to an embodiment of a TSE Dixon sequence with an excitation of a first and two further slices with an excitation pulse.

FIG. 6 is a sequence diagram according to an embodiment of a TSE Dixon sequence with the excitation of a first and two further slices, wherein the two further slices are excited with two excitation pulses.

DETAILED DESCRIPTION

Figure 3:
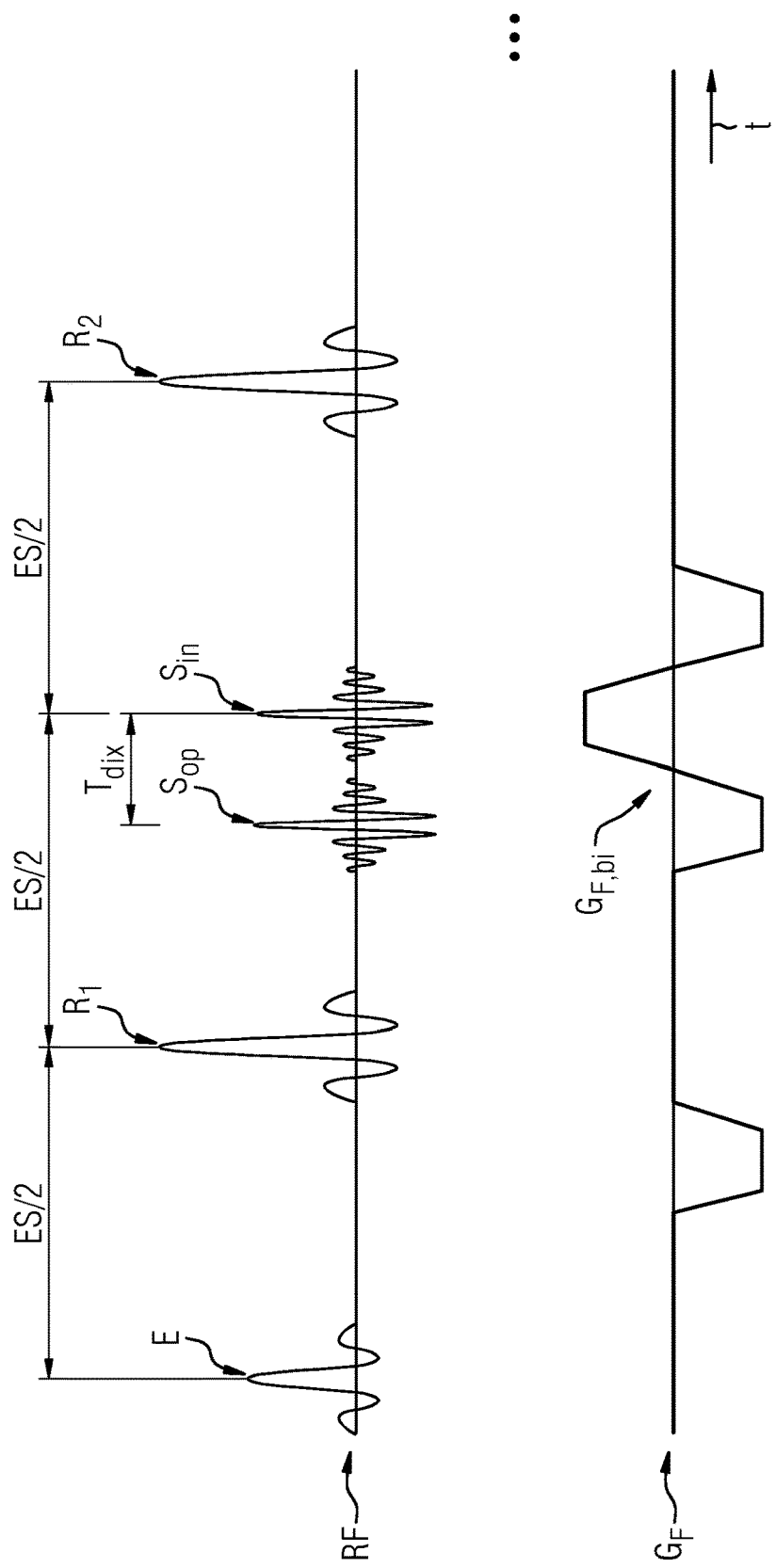
FIG. 3 is a sequence diagram of a TSE Dixon sequence according to the prior art.

FIG. 1 is a schematic view of a magnetic resonance apparatus 10. The magnetic resonance apparatus 10 includes a magnet unit 11 having a superconducting basic magnet 12 to generate a strong (e.g., constant) basic magnetic field 13 with a basic magnetic field strength $B_0$. The magnetic resonance apparatus 10 also includes a patient receiving area 14 for receiving a patient 15. In the present exemplary embodiment, the patient receiving area 14 has a cylindrical shape and is surrounded in a circumferential direction by the magnet unit 11. However, an embodiment of the patient receiving area 14 deviating therefrom may be provided. The patient 15 may be pushed into the patient receiving area 14 by a patient support device 16 of the magnetic resonance apparatus 10. The patient support device 16 includes a patient table 17 configured to be movable within the patient receiving area 14.

The magnet unit 11 also includes a gradient coil unit 18 for the generation of magnetic field gradients used for spatial encoding during imaging. The gradient coil unit 18 is controlled by a gradient control unit 19 of the magnetic resonance apparatus 10. The magnet unit 11 further includes a radio-frequency antenna unit 20 (e.g., configured as a body coil permanently embodied in the magnetic resonance apparatus 10). The radio-frequency antenna unit 20 is configured for the excitation of polarization that is established in the basic magnetic field 13 generated by the basic magnet 12. The radio-frequency antenna unit 20 is controlled by a radio-frequency antenna control unit 21 of the magnetic resonance apparatus 10 and irradiates radio-frequency magnetic resonance sequences (e.g., excitation pulses and/or refocusing pulses) into an examination chamber substantially formed by a patient receiving area 14 of the magnetic resonance apparatus 10. The radio-frequency antenna unit 20 is also configured to receive magnetic resonance signals.

To control the basic magnet 12, the gradient control unit 19, and the radio-frequency antenna control unit 21, the magnetic resonance apparatus 10 includes a system control unit 22. The system control unit 22 controls the magnetic resonance apparatus 19 centrally (e.g., for the performance of a predetermined imaging gradient echo sequence). The system control unit 22 also includes a unit (not shown in further detail) for the evaluation of medical image data acquired during the magnetic resonance examination. The magnetic resonance apparatus 10 also includes a user interface 23 connected to the system control unit 22. Control information (e.g., imaging parameters and reconstructed magnetic resonance images) may be displayed on a display unit 24 (e.g., on at least one monitor) of the user interface 23 for a medical operator. The user interface 23 also includes an input unit 25 by which the medical operator may input information and/or parameters during a scanning process.

The magnetic resonance apparatus 10 (e.g., the radio-frequency antenna unit 20 together with the radio-frequency antenna control unit 21 and the system control unit 22) is configured to carry out a method for the simultaneous reception of magnetic resonance signals from two or more slices (e.g., slices of the patient 15). FIG. 2 is a schematic diagram of the method for the simultaneous reception of magnetic resonance signals from two or more slices. The system control unit 22 includes corresponding software and/or computer programs that may be loaded into a memory of the system control unit 22, with a program for carrying out the method for the simultaneous reception of magnetic resonance signals from two or more slices when the program is executed in the system control unit 22 of the magnetic resonance apparatus 10.

According to FIG. 2, in act 110, first magnetic resonance signals of at least one first slice are excited at a first excitation time. In act 120, further magnetic resonance signals (e.g., second magnetic resonance signals) of at least one further slice are excited at an at least one further excitation time (e.g., a second excitation time). The at least one further excitation time may be a time before and/or after the first excitation time, and/or may coincide with the first excitation time. In act 130, the first and the further magnetic resonance signals are received at one reception time.

The magnetic resonance signals may be excited by radio-frequency excitation pulses generated by the radio-frequency antenna unit 20. The first and the further magnetic resonance signals may also be received by the radio-frequency antenna unit 20.

The system control unit 22 is further configured to use the received magnetic resonance signals to generate at least one in-phase image, at least one opposed-phase image, at least one water image, at least one fat image, and/or a combination of two or more of the aforementioned images.

Figs. 3 to 6 are schematic diagrams of variants of a sequence. However, before explaining this, prior art will be explained with reference to FIG. 3. FIG. 3 shows a conventional TSE Dixon sequence with an axis RF illustrating transmitted and received radio-frequency signals, and an axis $G_F$ illustrating a switching of a frequency encoding gradient and/or readout gradients over which the time t is depicted. As is also typical of other TSE sequences, this sequence includes at least one echo train with two or more successive echoes. In each echo train, after an excitation pulse E, a plurality of phase-encoding lines of a complete k-space is sampled. The excitation pulse E excites atomic nuclei of a slice. After the duration of one half the echo spacing ES/2, a first refocusing pulse $R_1$ is irradiated into the slices to be acquired. The echo spacing is typically the distance between two echoes (e.g., TSE or EPI sequences).

Following another one half the echo spacing ES/2, magnetic resonance signals $S_{in}$ resulting from the excitation E are received. The frequency-encoding gradient $G_F$ is switched suitably. These magnetic resonance signals $S_{in}$ are characterized in that the transverse magnetization of the protons in fat and water molecules have the same phase angle such that spins precess in phase. Magnetic resonance signals $S_{op}$ shifted in time thereto by a phase inversion time $T_{dix}$ that are characterized in that the transverse magnetization of the protons in fat and water molecules have an opposite phase angle (e.g., the phase angles are shifted with respect to one another by 180° or π) so that the spins precess in antiphase occur.

With the conventional Dixon technique, the acquisition of magnetic resonance signals is performed with the same and opposite phase angles (e.g., in different periods in each case). In a variant not shown, each echo train is acquired twice. At the second time, the readout time is shifted relative to the time by $T_{dix}$, which also results in a doubling of the scanning time. In the variant shown in FIG. 3 (e.g., also called a fast Dixon technique), a bipolar Gradient $G_{F,bi}$ is used. However, because the phase inversion time $T_{dix}$ is very short (e.g., only approximately 1.2 milliseconds with a basic magnetic field strength $B_0$ of 3 tesla), a poorer image quality is provided because the achievable readout bandwidth is relatively high and/or the achievable image resolution is relatively low. Due to the three gradient lobes of the bipolar gradient $G_{F,bi}$, the echo spacing ES is relatively high and, as a result, the scanning time is extended.

FIG. 4 shows an example according to an embodiment. In this embodiment, the excitation pulse $E_1$ excites first magnetic resonance signals of a first slice at a first excitation time and the excitation pulse $E_2$ excites second magnetic resonance signals of a second slice (e.g., the second magnetic resonance signals of the second slice are further magnetic resonance signals of a further slice) at a further excitation time (e.g., a second excitation time). The first excitation time and the second excitation time are spaced apart from one another by the phase inversion time $T_{dix}$. The phase inversion time $T_{dix}$ is substantially dependent upon a basic magnetic field strength $B_0$, a Larmor constant $\gamma$, and a chemical shift $\delta$ and may be expressed as $T_{dix}=(2B_0\gamma\delta)^{-1}$.

The excitation pulses $E_1$ and $E_2$ may either overlap or be separated if the excitation pulses $E_1$ and $E_2$ are sufficiently short. The shapes of the excitation pulse $E_1$ and $E_2$ do not have to be identical. Instead, one of the two pulses (e.g., $E_1$) may be a minimum-phase Shinnar-Le Roux pulse, and the other one of the two pulses (e.g., $E_2$) may be a maximum-phase Shinnar-Le Roux pulse.

After one half of the echo spacing ES/2, the excited nuclear spins of the first magnetic resonance signals are refocused by the refocusing pulse $R_{11}$ and the excited nuclear spins of the second magnetic resonance signals are refocused by the refocusing pulse $R_{12}$. The refocusing pulses $R_1$, $R_2$ are spaced apart from one another by $T_{dix}$, and are often 180° pulses for rephasing the excited nuclear spins.

Due to the excitation shifted by $T_{dix}$, following a further one half the echo spacing ES/2, magnetic resonance signals $S_{in,1}+S_{op,2}$ from the first and the second slice coincide in time after the application of the first refocusing pulse $E_1$ (e.g., first magnetic resonance signals $S_{in,1}$ including signal components of fat and water with the same phase angle and second magnetic resonance signals $S_{op,2}$ including signal components of fat and water with opposite phase angles). This enables the magnetic resonance signals from the two slices to be received simultaneously.

According to the known TSE technique, further sections of an echo train (e.g., spaced apart from one other by the echo spacing ES, as indicated by the following refocusing pulses $R_1^*$, $R_2^*$) are again time shifted relative to one another by the phase inversion time $T_{dix}$. In other words, the sequence shown in FIG. 4 for each slice in each case includes an echo train, where the pulses of the two echo trains are shifted in the same way with respect to one another by $T_{dix}$. This enables the Carr-Purcell-Meiboom-Gill conditions for TSE imaging to be fulfilled (e.g., requiring the refocusing pulses for a respective slice to be arranged uniformly in the sequence with same distances ES between two successive refocusing pulses), where the distance ES is twice as large as the distance between the excitation pulse and the first refocusing pulse.

In the example shown in FIG. 4, two slices are measured simultaneously. Higher acceleration factors may be achieved in that more than two slices are scanned simultaneously. For example, FIG. 5 shows an example in which, in addition to a first slice excited by an excitation pulse $E_1$ at a first excitation time, two further slices are excited simultaneously at a second excitation time by a multiband pulse $E_2+E_3$. The superimposition of two excitation pulses $E_2$ and $E_3$ increases the amplitude of the resultant multiband pulse $E_2+E_3$ compared to the excitation pulse $E_1$ at the first excitation time.

Similarly, the amplitude of the refocusing pulse $R_{12}+R_{13}$ is increased compared to the refocusing pulse $R_{11}$.

In accordance with the excitation times, the magnetic resonance signals $S_{in,1}$, $S_{op,2}$ and $S_{op,3}$ coincide in time and produce resultant magnetic resonance signals $S_{in,1}+S_{op,2}+S_{op,3}$. $S_{in,1}$ are magnetic resonance signals from the first slice with the same phase angle, and $S_{op,2}$ and $S_{op,3}$ are magnetic resonance signals from the second and third slice with the opposite phase angle for fat and water. The reception of signals from three instead of only two slices simultaneously is provided according to the embodiment depicted in FIG. 4, instead of only one slice according to the prior art, enables the required data-acquisition time for three or more slices to be further reduced using the Dixon technique.

However, contrary to the embodiment shown in FIG. 5, one or more further slices may be excited simultaneously at the first excitation time.

A further embodiment of the method is described below with reference to FIG. 6. In this case, a total of three different slices are excited at three different excitation times (e.g., a first slice with the excitation pulse $E_1$, a second slice with the excitation pulse $E_2$ and a third slice with the excitation pulse $E_3$). Both the excitation times and the refocusing times are spaced apart from one another by $T_{dix}$.

The refocusing of the three slices takes place by refocusing pulses $R_1$, $R_2$ and $R_3$ after one half the echo spacing ES/2 following the respective excitation. Following the period of one half the echo spacing ES/2 after the refocusing of the nuclear spins of first slice, the magnetic resonance signals $S_{in,1}$ (e.g., magnetic resonance signals from the first slice with the same phase angle), $S_{op,2}$ (e.g. magnetic resonance signals from the second slice with the opposite phase angle), and $S_{op,3}$ (e.g., magnetic resonance signals from the slice with the opposite phase angle) are superimposed to form a resultant signal $S_{op,2}+S_{in,1}+S_{op+3}$. The superimposed resultant signal is received by the magnetic resonance apparatus 10.

The method according to the embodiments depicted in FIGS. 4-6, with reference to a TSE sequence, may also be transferred to other sequence types (e.g., such as EPI sequences and/or HASTE sequences). Moreover, it is also possible to apply optimization methods for simultaneous multi-slice acquisition (e.g., CAIPIRINHA, blipped CAIPI, slice-GRAPPA (SG), split slice-GRAPPA (SP-SG), and/or simultaneous echo refocusing (SER)).

Although the invention was illustrated in more detail by the preferred exemplary embodiments, the invention is not restricted by the disclosed examples, and other variations may be derived herefrom by the person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for a simultaneous reception of magnetic resonance signals from two or more slices, the method comprising:
exciting, by a radio-frequency unit of a magnetic resonance apparatus, first magnetic resonance signals of at least one first slice in an object at a first excitation time;
exciting, by the radio-frequency unit of the magnetic resonance apparatus, second magnetic resonance signals of at least one second slice in the object at an at least one second excitation time; and
receiving, simultaneously by the magnetic resonance apparatus, the first magnetic resonance signals and the second magnetic resonance signals at one reception time,
wherein the first excitation time is identical to the at least one second excitation time or spaced apart from the at least one second excitation time by an integral multiple N of a phase inversion time $T_{dix}$,
wherein the phase inversion time $T_{dix}$ is a function of a basic magnetic field strength $B_0$, a Larmor constant $\gamma$, and a chemical shift $\delta$.

2. The method of claim 1, wherein $T_{dix}$ is $(2B_0\gamma\delta)^{-1}$.

3. The method of claim 1, wherein the received first magnetic resonance signals and the received second magnetic resonance signals have signal components with a same phase angle, an opposite phase angle, or the same phase angle and the opposite phase angle.

4. The method of claim 1, wherein the received first magnetic resonance signals and the received second magnetic resonance signals are used to generate at least one in-phase image, at least one opposed-phase image, or the at least one in-phase image and the at least one opposed-phase image.

5. The method of claim 1, wherein the received first magnetic resonance signals and the received second magnetic resonance signals are used to generate at least one water image, at least one fat image, or the at least one water image and the at least one fat image.

6. The method of claim 1, wherein the exciting of the first magnetic resonance signals, the exciting of the second magnetic resonance signals, and the receiving of the first and the second magnetic resonance signals are performed repeatedly in a plurality of passes, and
wherein magnetic resonance signals with same and opposite phase angles are received for different slices.

7. The method of claim 6, wherein the excited slices of each pass of the plurality of passes are selected such that the excited slices are spaced as far apart as possible from one another.

8. The method of claim 1, wherein the exciting of the first magnetic resonance signals at the first excitation time is performed using a first excitation pulse and the exciting of the second magnetic resonance signals at the at least one second excitation time is performed using at least one second excitation pulse, and
wherein the first excitation pulse and the at least one second excitation pulse are identical or at least partially different.

9. The method of claim 8, wherein at least one of the first excitation pulse and the second excitation pulse is a minimum phase Shinnar-Le Roux pulse or at least one of the first excitation pulse and the second excitation pulse is a maximum phase Shinnar-Le Roux pulse.

10. The method of claim 1, further comprising:
refocusing the first magnetic resonance signals using a first refocusing pulse; and
refocusing the second magnetic resonance signals using at least one second refocusing pulse,
wherein the first refocusing pulse and the at least one second refocusing pulse are identical or at least partially different.

11. The method of claim 10, wherein at least one of the first refocusing pulse and the second refocusing pulses is a minimum phase Shinnar-Le Roux pulse or at least one of the first refocusing pulse and the second refocusing pulse is a maximum phase Shinnar-Le Roux pulse.

12. The method of claim 1, wherein a plurality of slices are simultaneously excited at the first excitation time, at one or more of the at least one second excitation times, or at the first excitation time and at one or more of the at least one second excitation times.

13. The method of claim 12, wherein the plurality of slices are excited by a multiband pulse.

14. The method of claim 1, wherein the exciting of the first magnetic resonance signals, the exciting of the second magnetic resonance signals, and the receiving of the first magnetic resonance signals and the second magnetic resonance signals are performed within a gradient echo sequence, a spin echo sequence, or the gradient echo sequence and the spin echo sequence.

15. The method of claim 14, wherein the gradient echo sequence, the spin echo sequence, or the gradient echo sequence and the spin echo sequence each comprise a turbo spin echo sequence, a HASTE sequence, or a PROPELLER/BLADE sequence.

16. The method of claim 1, further comprising:
performing, within an optimization method, a simultaneous multi-slice acquisition, the simultaneous multi-slice acquisition comprising CAIPIRINHA, blipped CAIPI, simultaneous Echo refocusing (SER), slice-GRAPPA (SG), split slice-GRAPPA (SP-SG), Hadamard encoding, or any combination thereof.

17. A magnetic resonance apparatus comprising:
a radio-frequency antenna unit,
wherein the magnetic resonance apparatus is configured for a simultaneous reception of magnetic resonance signals from two or more slices, the magnetic resonance apparatus further configured to:
excite first magnetic resonance signals of at least one first slice in an object at a first excitation time with the radio-frequency antenna unit;
excite second magnetic resonance signals of at least one second slice in the object at an at least one second excitation time with the radio-frequency antenna unit; and
receive, simultaneously, the first magnetic resonance signals and the second magnetic resonance signals at one reception time with the radio-frequency antenna unit,
wherein the first excitation time is identical to the at least one second excitation time, is spaced apart from the at least one second excitation time by an integral multiple N of a phase inversion time $T_{dix}$, or is identical to the at least one second excitation time and is spaced apart from the at least one second excitation time by the integral multiple N of the phase inversion time $T_{dix}$, wherein the phase inversion time $T_{dix}$ is a function of a basic magnetic field strength $B_0$, a Larmor constant $\gamma$, and a chemical shift $\delta$.

18. The magnetic resonance apparatus of claim 17, wherein the magnetic resonance apparatus is further configured to:
   refocus the first magnetic resonance signals using a first refocusing pulse; and
   refocus the second magnetic resonance signals using at least one second refocusing pulse,
   wherein the first refocusing pulse and the at least one second refocusing pulse are identical or at least partially different.

19. The magnetic resonance apparatus of claim 17, wherein $T_{dix}$ is $(2B_0\gamma\delta)^{-1}$.

* * * * *